(12) United States Patent
Morita et al.

(10) Patent No.: US 12,068,421 B2
(45) Date of Patent: Aug. 20, 2024

(54) LIGHT RECEPTION ELEMENT AND LIGHT SHIELDING STRUCTURE FOR OPTICAL CIRCUIT

(71) Applicants: NTT Electronics Corporation, Yokohama (JP); Nippon Telegraph and Telephone Corporation, Tokyo (JP)

(72) Inventors: Keiichi Morita, Yokohama (JP); Atsushi Murasawa, Yokohama (JP); Hiroki Kawashiri, Yokohama (JP); Yusuke Nasu, Atsugi (JP)

(73) Assignees: NTT ELECTRONICS CORPORATION, Yokohama (JP); NIPPON TELEGRAPH AND TELEPHONE CORPORATION, Tokyo (JP)

( * ) Notice: Subject to any disclaimer, the term of this patent is extended or adjusted under 35 U.S.C. 154(b) by 317 days.

(21) Appl. No.: 17/619,070

(22) PCT Filed: Jun. 15, 2020

(86) PCT No.: PCT/JP2020/023475
§ 371 (c)(1),
(2) Date: Dec. 14, 2021

(87) PCT Pub. No.: WO2020/255936
PCT Pub. Date: Dec. 24, 2020

(65) Prior Publication Data
US 2022/0399467 A1    Dec. 15, 2022

(30) Foreign Application Priority Data
Jun. 18, 2019    (JP) .................................. 2019-112841

(51) Int. Cl.
*H01L 31/0224*    (2006.01)
*H01L 31/0232*    (2014.01)
*H01L 31/105*    (2006.01)

(52) U.S. Cl.
CPC ................. *H01L 31/022408* (2013.01); *H01L 31/02327* (2013.01); *H01L 31/105* (2013.01)

(58) Field of Classification Search
CPC .............................................. H01L 31/022408
See application file for complete search history.

(56) References Cited

U.S. PATENT DOCUMENTS 5,461,419 A    10/1995    Yamada
7,373,034 B2    5/2008    Shimizu et al.
(Continued)

FOREIGN PATENT DOCUMENTS

CN    1386305 A    12/2002
CN    102456698 A    5/2012
(Continued)

OTHER PUBLICATIONS

Notice of Grant dated Aug. 21, 2023, issued in Chinese Application No. 202080044710.8.
(Continued)

*Primary Examiner* — Suberr L Chi
(74) *Attorney, Agent, or Firm* — Workman Nydegger (57) ABSTRACT

A light shielding structure of an optical circuit of the present invention uses a part of the structure of the light reception element itself to suppress stray light. A stepped electrode that covers an upper surface and side surface of a first semiconductor layer constituting a light absorption portion of the light reception element is formed at a height substantially equal to that of an optical waveguide in the optical circuit, and the light absorption portion of the light reception element is shielded from stray light by a wall-shaped or (Continued)

column-shaped wiring electrode extending substantially perpendicularly to a surface layer of the optical circuit. The light shielding structure of the present invention uses a part of the configuration of the light reception element, is formed integrally with the light reception element, and also has an aspect of the invention of the light reception element.

10 Claims, 7 Drawing Sheets

(56) References Cited

U.S. PATENT DOCUMENTS

| | | | |
|---|---|---|---|
| 2003/0106987 A1 | 6/2003 | Komaba et al. | |
| 2003/0218229 A1* | 11/2003 | Janssen | H01P 5/02 |
| | | | 257/458 |
| 2007/0263957 A1 | 11/2007 | Shimizu et al. | |
| 2012/0104523 A1 | 5/2012 | Ikeda | |
| 2012/0273909 A1* | 11/2012 | Koyama | H01L 31/105 |
| | | | 257/E31.103 |
| 2012/0299070 A1 | 11/2012 | Yamada et al. | |
| 2014/0103347 A1 | 4/2014 | Ishino | |
| 2014/0145252 A1 | 5/2014 | Kim et al. | |
| 2017/0012143 A1 | 1/2017 | Usami et al. | |
| 2019/0109167 A1 | 4/2019 | Inoue et al. | |
| 2019/0181275 A1 | 6/2019 | Tsuchiya et al. | |

FOREIGN PATENT DOCUMENTS

| | | |
|---|---|---|
| CN | 102800735 A | 11/2012 |
| CN | 106340562 A | 1/2017 |
| CN | 108475705 A | 8/2018 |
| CN | 109313072 A | 2/2019 |
| CN | 109659300 A | 4/2019 |
| EP | 0 361 515 A2 | 9/1989 |
| JP | H06-133224 A | 5/1994 |
| JP | 4626614 | 11/2010 |
| JP | 2014-49692 A | 3/2014 |
| JP | 2017-22175 A | 1/2017 |
| JP | 2019-16628 A | 1/2019 |
| WO | 2010/004850 A1 | 1/2010 |

OTHER PUBLICATIONS

Notice of Grant dated Aug. 21, 2023, issued Japanese Application No. 202080044710.5.
*A Compact Integrable Photodiode has Achieved Light-Receiving Sensitivity of 21.8 A/W*, Nedo, retrieved on Mar. 1, 2019, Internet <URL: https:/www.nedo.go.jp/news/press/AA5_101073.html>, pp. 1-3.
*A High-Performance Light Modifier has been Realized on a Silicon Platform*, NTT, retrieved on Mar. 1, 2019, Internet <URL: http://www.ntt.co.jp/news2017/1707/170718a.html>.
International Search Report dated Jul. 21, 2020, issued in PCT Application No. PCT/JP2020/023475, filed Jun. 15, 2020.

* cited by examiner

LIGHT RECEPTION ELEMENT AND LIGHT SHIELDING STRUCTURE FOR OPTICAL CIRCUIT

TECHNICAL FIELD

The present invention relates to a light reception element. More specifically, the present invention relates to a light shielding structure for a light reception element of an optical circuit.

BACKGROUND ART

The "digital coherent optical transmission technology," which realizes optical transmission above 100 Gbps, is now in widespread use and realizes an increase in speed and capacity of an optical network. This increases a necessity to downsize a digital coherent optical transmission apparatus such as a "digital coherent transceiver." In an optical transmission apparatus, the specification of a removable digital coherent transceiver (hereinafter referred to as a transceiver for simplification) which processes optical signals of a plurality of channels is defined. The power consumption and size of the transceiver are specified by the specification of a standards organization such as the Optical Internetworking Forum (OIF).

The width of a first-generation transceiver for 100 Gbps is about 80 mm in the OIF specification, whereas a next-generation transceiver for 400 Gbps is downsized to about 20 mm (for example, the CFP8 or OSFP specification). Accordingly, an optical transmission/reception device, which is one of major constituent elements of the transceiver, is also required to have a size of about 10 to 20 mm$^2$. The optical transmission/reception device is a module obtained by mounting optical components and electrical components on a multilayer wiring substrate, into which optical transmission/reception functions such as an optical modulator and a coherent receiver are integrated. The optical component is configured as a photonic integrated circuit (PIC) on a single substrate of silicon, quartz, InP, or the like. For example, there is known an optical transmission/reception device in which electronic components such as a PIC configured on a silicon substrate, an electrical signal IC, and a capacitor are mounted on a ceramic substrate.

An optical transmission/reception device is supplied with high level light from a light source used in a transmitter and a light source for supplying local oscillator light (Lo light) of a receiver outside the device through an optical fiber. The light is given to the transmitter and receiver by optical coupling with the PIC, while light not optical-coupled behaves as stray light in the PIC. The stray light acts as noise with respect to a light reception element (such as a photodetector) in the receiver and a level monitoring element for transmission light and causes deterioration in various functions of the optical transmission/reception device. As a countermeasure against stray light in an optical transmission/reception device, for example, PTL 1 discloses a conductive via structure prepared in a vacant region not having the transmission/reception function in a PIC.

Figure 6:
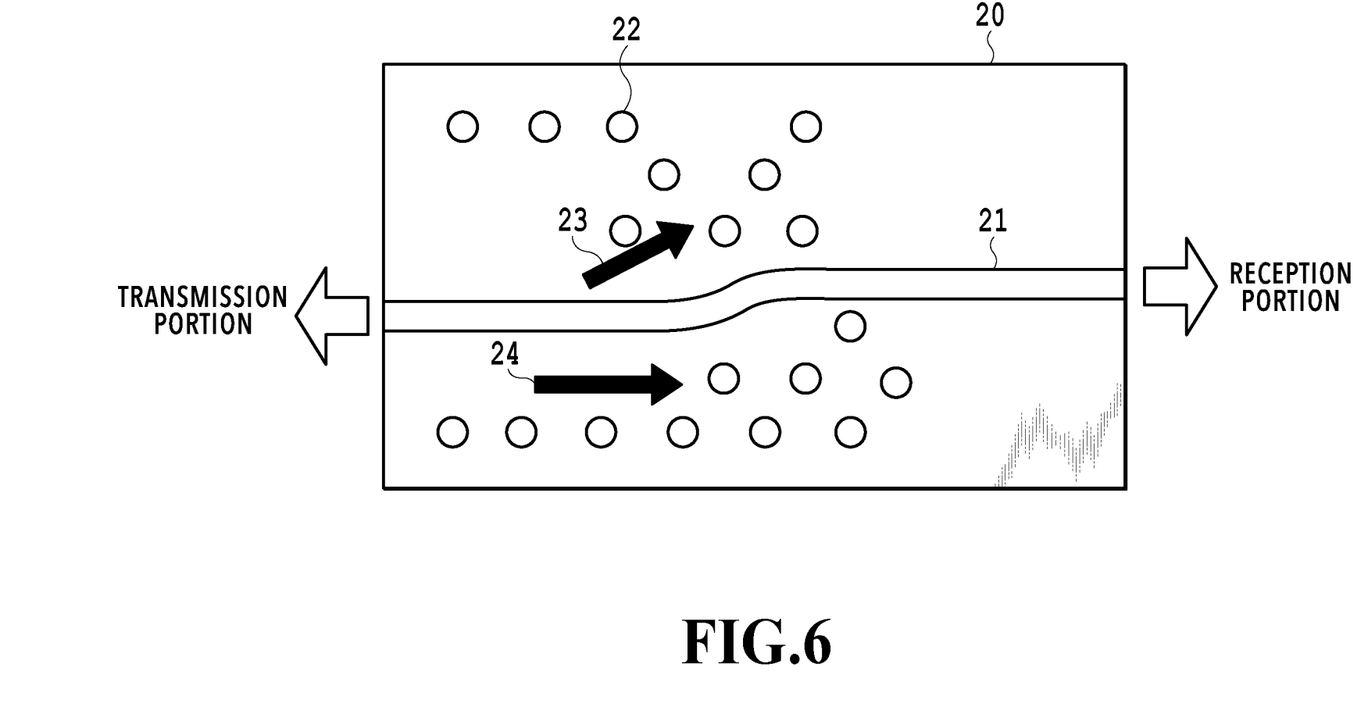
FIG. 6 is a diagram showing a conductive via structure which suppresses stray light in a conventional optical circuit.

FIG. 6 is a diagram showing a conductive via structure for suppressing stray light in a conventional optical circuit. FIG. 6 is a top view of a part of an optical circuit 20 seen from a direction perpendicular to a substrate plane and shows the periphery of an optical waveguide 21 connecting a reception portion including a light reception element to a transmission portion. It is shown that stray light 23, 24 produced in the transmission portion propagates through the substrate toward the reception portion and is coupled to the light reception element of the reception portion. The optical circuit 20 comprises a number of conductive vias 22 on both sides of the optical waveguide 21. The conductive vias 22 inhibit the stray light 23, 24 from traveling in straight lines, thereby suppressing stray light reaching the light reception element of the reception portion.

As different configurations for suppressing stray light, there are known a conductive wall disclosed in PTL 1, a configuration of forming a groove in a substrate such that an air layer in the groove reflects stray light, and the like. All of these light shielding structures are configured in a vacant portion of the substrate not realizing the optical transmission/reception function.

CITATION LIST

Patent Literature

PTL 1: Japanese Patent No. 4626614

Non Patent Literature

NPL 1: "A compact integrable photodiode has achieved light-receiving sensitivity of 21.8 A/W," NEDO, retrieved on Mar. 1, 2019, Internet <URL: https://www.nedo.go.jp/news/press/AA5_101073.html>

NPL 2: "A high-performance light modifier has been realized on a silicon platform," NTT, retrieved on Mar. 1, 2019, Internet <URL: http://www.ntt.co.jp/news2017/1707/170718a.html>

SUMMARY OF INVENTION

Technical Problem

However, it is difficult to apply a conventional configuration for suppressing stray light to an optical transmission/reception device downsized to about 10 to 20 mm$^2$. In a next-generation optical transmission/reception device, a silicon substrate in a PIC of the optical transmission/reception device is downsized to about 10 mm$^2$ and transmitter and receiver blocks are arranged on the substrate without any gap. Thus, there is no sufficient vacant area irrelevant to the optical transmission/reception function and it is difficult to arrange conductive vias as shown in FIG. 6 in positions effective against stray light. Even if the arrangement is possible, the conductive vias must be close to the functional portion for light transmission/reception.

A structure such as a conductive via, wall, or groove changes the stress of the substrate. For example, the stress brings about a situation where a branching ratio of an optical branch circuit is not at a designed value or varies. Further, it is also known that a change in stress of the substrate deteriorates the polarized wave separation performance of a polarized wave separator or changes an optical path length difference of an interferometer.

As stated above, in a PIC with an extremely increased degree of integration, a position to arrange a conductive via, wall, or groove as a countermeasure against stray light is limited and it is difficult to deal with diffused or reflected light produced by the conductive via or wall. Even if the arrangement is possible, there is a problem that a deviation, variation, or unevenness is produced in a characteristic value of the optical circuit function, which makes it difficult to design a circuit to effectively suppress stray light reaching the light reception element. Since the integration of an optical transmission/reception device is proceeding to incorporate a new function such as a monitoring circuit outside a substrate into a single silicon substrate, it will be more difficult to take countermeasures against stray light in the future.

The present invention has been accomplished in view of the problems stated above. An object of the present invention is to provide an effective light shielding structure in an increasingly integrated optical circuit.

Solution to Problem

To solve the above problem, an aspect of the present invention can be a light reception element comprising: a substrate: a first semiconductor layer being configured above the substrate and operating as a light absorption portion; and a second semiconductor layer which being formed on the first semiconductor layer or adjacent to the first semiconductor layer and having a semiconductor type different from a semiconductor type of the first semiconductor layer, the light reception element further comprising: a stepped electrode configured continuously as one piece on an upper surface of an edge including one or more sides of a region of the first semiconductor layer, a side surface of the edge, and an upper surface of a layer in contact with a lower side of the first semiconductor layer, the region being within a substrate plane of the substrate: and a wall-shaped or column-shaped wiring electrode being formed perpendicularly from a bottom of the stepped electrode toward a surface layer, the wiring electrode extracting a detection electrical signal from the light reception element.

The wiring electrode can be formed substantially in parallel to one side of the one or more sides and can have a width equal to or greater than a length of the one side of the region.

The wiring electrode can be wall-shaped, L-shaped, or U-shaped when viewed on the substrate plane. Further, the wiring electrode can be formed to slant with respect to one side of the one or more sides.

According to another aspect of the present invention, the wiring electrode can include: a first interlayer wiring electrode formed perpendicularly from the bottom of the stepped electrode toward an intermediate wiring layer, the intermediate wiring layer being closer to the surface layer than the stepped electrode configured within the substrate; and a second interlayer wiring electrode formed perpendicularly from the intermediate wiring layer toward the surface layer. The wiring electrode can further include a similar third interlayer wiring electrode.

According to yet another aspect of the present invention, in the light reception element, the first semiconductor layer can be p-type silicon and the second semiconductor layer can include an insulating i-type germanium layer and an n-type germanium layer sequentially stacked on the first semiconductor layer to configure a PIN-type photodiode.

According to yet another aspect of the present invention, the light reception element can be configured such that the first semiconductor layer and the second semiconductor layer are formed along the substrate plane with an intermediate region interposed therebetween and have semiconductor types different from each other, a PIN junction is formed by the first semiconductor layer, the intermediate region, and the second semiconductor layer, and the stepped electrode is formed with respect to one or more sides of a region including the first semiconductor layer and the second semiconductor layer. This aspect corresponds to a light reception element of a fourth embodiment.

The area of the first semiconductor layer can preferably be a rectangular region. Further, the light reception element described above can be configured in a digital coherent transmission/reception device.

Advantageous Effects of Invention

An effective light shielding structure and a light reception element structure can be provided in an increasingly integrated optical circuit.

BRIEF DESCRIPTION OF DRAWINGS

FIGS. 7(a) and (b) show another configuration example of a photodiode (PD) formed by sequentially stacking different layers on a substrate

DESCRIPTION OF EMBODIMENTS

In a light reception element that requires a countermeasure against stray light, a light shielding structure of an optical circuit of the present invention can use a part of the structure of the light reception element itself to suppress stray light. In a conventional technique, light shielding is performed by a structure irrelevant to the configuration of the light reception element. In contrast, in the present invention, stray light is suppressed using a part of a structure constituting an electrode which outputs an electrical signal from the light reception element. A light absorption portion of the light reception element is shielded from stray light by a wall-shaped or column-shaped wiring electrode substantially equal in height to an optical waveguide in an optical circuit and extending substantially perpendicularly to a surface layer of the optical circuit so as to shield a first semiconductor layer constituting the light absorption portion of the light reception element. Since the light shielding structure of the optical circuit of the present invention uses a part of the configuration of the light reception element and is formed integrally with the light reception element, it also has an aspect of the invention of the light reception element.

A wiring electrode having the light shielding function extends perpendicularly to a surface layer of the optical circuit from the bottom of a stepped electrode formed continuously as one piece on the upper surface and side surface of a first semiconductor layer and the upper surface of a layer in contact with the lower side of the first semiconductor layer. The wiring electrode having the light shielding function constitutes a part of an electrode which obtains a detection electrical signal from the light reception element. When viewing the optical circuit from above, the wiring electrode having the light shielding function is away from the first semiconductor layer at a distance not influencing the optical properties of the light reception element and has a width at least equal to or greater than the width of the first semiconductor layer in parallel to one side of the region of the first semiconductor layer. The wiring electrode having the light shielding function may slant with respect to a side of the region defined by the first semiconductor layer and have two or more sides at an angle. Thus, the light shielding electrode may have a shape such as an L shape or a U shape instead of a wall shape or a column shape. Further, the optical circuit may be provided with an absorber which absorbs reflected or diffused light from the wiring electrode having the light shielding function.

The wiring electrode having the light shielding function described above may be configured to extend from the surface layer of the optical circuit to the inside of the substrate beyond the lower surface of the first semiconductor layer. Further, the wiring electrode may be formed continuously from the first layer to the surface layer of the optical circuit. A plurality of light shielding electrodes may be formed across multiple layers via an inner electrode layer formed in the optical circuit. The light shielding structure of the present invention will be described below with reference to the drawings.

First Embodiment

FIGS. 1(a) and 1(b) illustrate a part of an optical circuit including a light shielding structure according to a first embodiment of the present invention. FIG. 1(a) is a top view showing a part of an optical circuit 1 included in an optical transmission/reception device, the optical circuit including a light reception element. FIG. 1(b) is a diagram showing a cross section perpendicular to a substrate plane including IB-IB' line passing through the light reception element. In order to improve visibility of the internal configuration, the top view of FIG. 1(a) does not show an uppermost buried layer 10 to be described later. With reference to FIG. 1(a), an optical waveguide 3 is connected to a first semiconductor layer 4, which is a doping region. Although the doping layer is hereinafter described as an ion implantation layer, various methods including thermomigration can be used for doping instead of ion implantation.

Substantially in the center of the region of the first semiconductor layer 4, a second semiconductor layer 5 having a smaller area and being of a semiconductor type different from a semiconductor type of the first semiconductor layer 4 and an electrode 6 are sequentially formed. A light reception element is formed substantially in the center of the region of the first semiconductor layer 4, which is an ion implantation layer, and a light absorption portion of the light reception element is formed near the second semiconductor layer 5. For example, the second semiconductor layer 5 is substantially rectangular when viewed from above and has a trapezoidal cross section perpendicular to the substrate. The electrode 6 is formed on the upper surface of the second semiconductor layer 5. The electrode 6 does not necessarily have to be provided over the entire surface of the second semiconductor layer 5 as shown in FIGS. 1(a) and 1(b). In all the configuration examples described below, the upper surface region of the first semiconductor layer 4 and the upper surface region of the second semiconductor layer 5 are shown as rectangular regions. However, the light reception element can have various shapes. It should be noted that the shape is not limited to the rectangular configuration shown in FIGS. 1(a) and (b) but also include a trapezoid, an ellipse, a circle, and a shape partially including a curved edge. Similarly, the shapes of the cross sections of the first semiconductor layer 4 and the second semiconductor layer 5 are also not limited to a rectangle or trapezoid. In the optical circuit 1 of FIGS. 1(a) and 1(b), only a single light reception element and a corresponding light shielding structure are shown in the optical circuit of the optical transmission/reception device. It is shown that stray light 12 propagates through the substrate from the left of the drawing and reaches the light reception element.

With reference to the cross-sectional view of FIG. 1(b), the first semiconductor layer 4, which is an ion implantation layer, the second semiconductor layer 5, and the electrode 6 are sequentially stacked on a substrate 2 as described above. A wiring electrode 7 is formed perpendicularly to the substrate plane from the electrode 6 toward a surface layer of the optical circuit. The wiring electrode 7 is further connected to an unshown wiring electrode on the surface layer of the optical circuit. In a case where the first semiconductor layer 4 is a p-type semiconductor (Si), the electrodes 6 and 7 become cathodes of the light reception element. A cross-sectional region 11 including the first semiconductor layer 4 and the second semiconductor layer 5 forms the light reception element. In a case where the first semiconductor layer 4 is a p-type semiconductor (Si), a stepped electrode 8 and a wiring electrode 9 become anodes of the light reception element. The first semiconductor layer 4 is provided with the one-piece stepped electrode 8 formed continuously from the upper surface of an edge of a side close to the source of the stray light 12 to the upper surface of the substrate 2 in contact with the lower side of the first semiconductor layer 4 through the side surface of the edge. The wiring electrode 9 is formed perpendicularly from the bottom of the stepped electrode 8 toward the surface layer of the optical circuit. The entire light reception element described above is covered with the buried layer 10.

FIGS. 1(a) and 1(b) show a configuration example of a photodiode (PD) formed by sequentially stacking different layers on a substrate in consideration of the configuration of a PD frequently used for an integrated optical circuit. Accordingly, it should be noted that all the light reception elements described herein roughly show actual device structures while omitting or simplifying layers and the like irrelevant to the photovoltaic conversion function as the light reception elements. More specifically, in an optical transmission/reception device using a PIC prepared on a silicon substrate, a PIN diode is widely used as a light reception element. There is known a PIN diode in which the first semiconductor layer 4 is formed of p-type silicon on an Si substrate 2 and the second semiconductor layer 5 includes two layers. The second semiconductor layer 5 can include, for example, an insulating i-type germanium layer as a lower layer and an n-type germanium layer as an upper layer thereof. Accordingly, in a case where the light reception element is a PIN diode, the second semiconductor layer 5 in FIGS. 1(a) and 1(b) corresponds to an i-type germanium layer and an n-type germanium layer. Incidentally, in an actual PIN diode, a layer not contributing to light absorption such as an $SiO_2$ layer is also formed between the first semiconductor layer 4 formed of p-type silicon and the silicon substrate 2. In the following description, a layer located under the first semiconductor layer 4 and irrelevant to the light absorbing function of the PD is considered to be included in the substrate 2.

Figure 7:
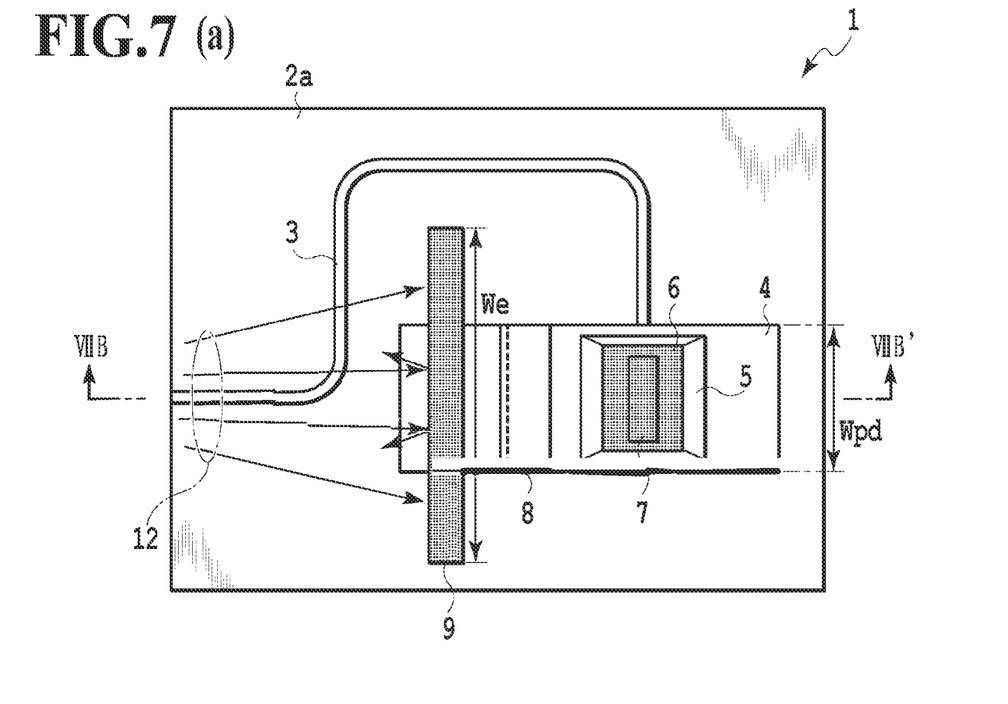

FIGS. 7(a) and 7(b) show another configuration example of a photodiode (PD) formed by sequentially stacking different layers on a substrate in consideration of the configuration of a PD frequently used for an integrated optical circuit. A layer 2a not contributing to light absorption such as an SiO₂ layer is also formed between the first semiconductor layer 4 formed of p-type silicon and the silicon substrate 2.

As described above, although a specific configuration of a PD differs according to its type such as a PN-type PD, a PIN-type PD, or an avalanche photodiode (APD), it should be noted that both of the first semiconductor layer 4 and the second semiconductor layer 5 constitute a light absorption portion which has the photovoltaic conversion action. Further, the first semiconductor layer 4 is a light absorption portion in the lowermost layer and is close to the substrate 2. The stepped electrode 8 is formed continuously as one piece from the upper surface of the edge of the first semiconductor layer 4 including the side close to the source of the stray light 12 to the upper surface of the substrate 2 in contact with the lower side of the first semiconductor layer 4 through the side surface of the edge. It should be noted that since the wiring electrode 9 is formed perpendicularly from the bottom of the stepped electrode 8 toward the surface layer of the optical circuit, the wiring electrode 9 is configured to shield the front surface of the light absorption portion when viewed from the source of the stray light 12.

Figure 1:
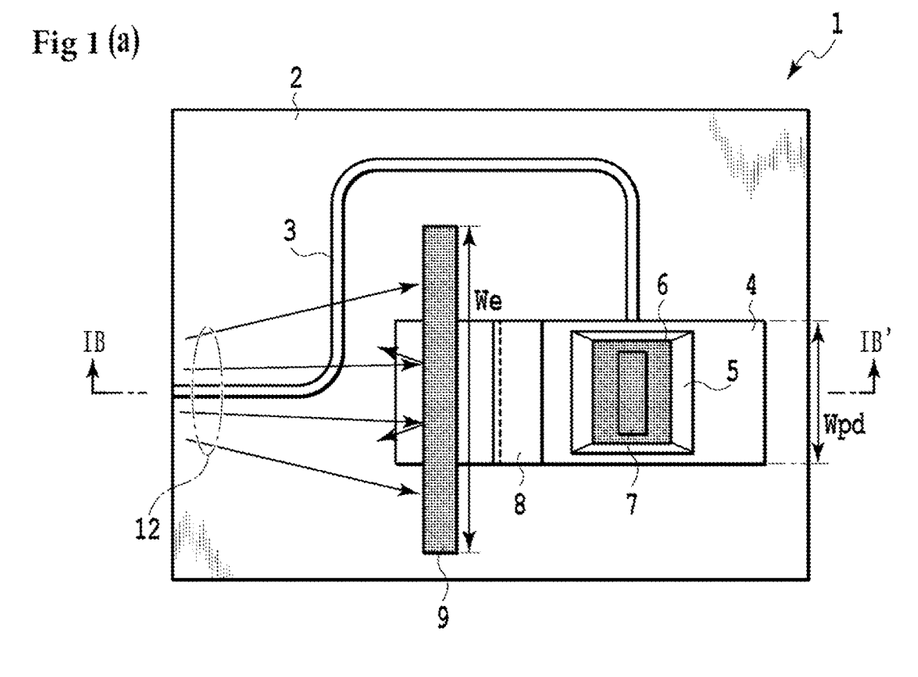
FIGS. 1(a) and 1(b) illustrate a part of an optical circuit including a light shielding structure according to a first embodiment of the present invention.

Referring to FIG. 1(*a*) again, the wiring electrode 9 is parallel to one of the sides of the first semiconductor layer 4 constituting the light absorption portion of the light reception element and is configured at a distance from the edge of the first semiconductor layer 4. The stepped electrode 8 covers the entire side surface of the edge of the first semiconductor layer 4. The wiring electrode 9 is further connected to another unshown wiring electrode on the surface layer of the optical circuit and, if the substrate 2 is a p-type semiconductor, becomes an anode of the light reception element. In a general silicon optical circuit, the optical waveguide 3 and the first semiconductor layer 4 are formed by the same etching process. After that, a doping process such as ion implantation is applied to only the region of the first semiconductor layer 4 to form a light reception element and the region of a light absorption portion of the light reception element is partitioned. Accordingly, in a thickness direction of the substrate of the optical circuit, the optical waveguide 3 and the first semiconductor layer 4 are substantially equal in height. A source of stray light is often equal in height to the optical waveguide 3 or closer to the surface layer of the optical circuit. Thus, the wiring electrode 9 effectively acts so as to prevent stray light from being coupled to the first semiconductor layer 4.

The stepped electrode 8 is formed continuously as one piece on the surface under the first semiconductor layer 4, that is, on the surface of the substrate 2 under the first semiconductor layer 4. The wall-shaped wiring electrode 9 formed from the bottom of the stepped electrode 8 to the surface layer of the optical circuit shields substantially the entire cross-sectional region 11 corresponding to the light reception element when viewed from the assumed source of the stray light 12 and functions as a light shielding electrode. The stray light 12 is produced in a case where light supplied from the outside of the optical transmission/reception device through an optical fiber cannot be coupled at the light coupling portion on the optical circuit. The stray light 12 has a possibility of coming from various places. For example, since the light is reflected on the side surface of the substrate 2 of the optical circuit and propagates in every direction, the stray light 12 is not sufficiently cut off only by the stepped electrode 8 configured in the direction of the source of the stray light 12.

In the optical circuit including the light shielding structure according to the present invention, the stray light 12 is reflected or diffused by the wiring electrode 9 formed in the middle of a propagation path before the stray light 12 propagates through the surfaces constituting the optical circuit and reaches the light absorption portion of the light reception element. As a result, the wiring electrode 9 having a size sufficiently larger than the light reception element suppresses coupling between the light reception element and the stray light 12. It should be noted that the light shielding function in the light shielding structure of the present invention is realized using the wiring electrode 9 for extraction of an electrical signal from the light reception element. Thus, the light shielding structure can be realized using some of the constituent elements of the light reception element without making a change to a conventional process of preparing various optical functions necessary for an optical transmission/reception device on a silicon substrate.

Therefore, the present invention can be implemented as a light reception element comprising: a substrate 2: a first semiconductor layer 4 being configured above the substrate and operating as a light absorption portion; and a second semiconductor layer 5 being formed on the first semiconductor layer and having a semiconductor type different from a semiconductor type of the first semiconductor layer, the light reception element further comprising: a stepped electrode 8 being integrally configured on an upper surface of an edge including one or more sides of a region of the first semiconductor layer, a side surface of the edge, and an upper surface of a layer in contact with a lower side of the first semiconductor layer, the region being within a substrate plane of the substrate: and a wall-shaped or column-shaped wiring electrode 9 being formed perpendicularly from a bottom of the stepped electrode toward a surface layer, the wiring electrode extracting a detection electrical signal from the light reception element.

Figure 2:
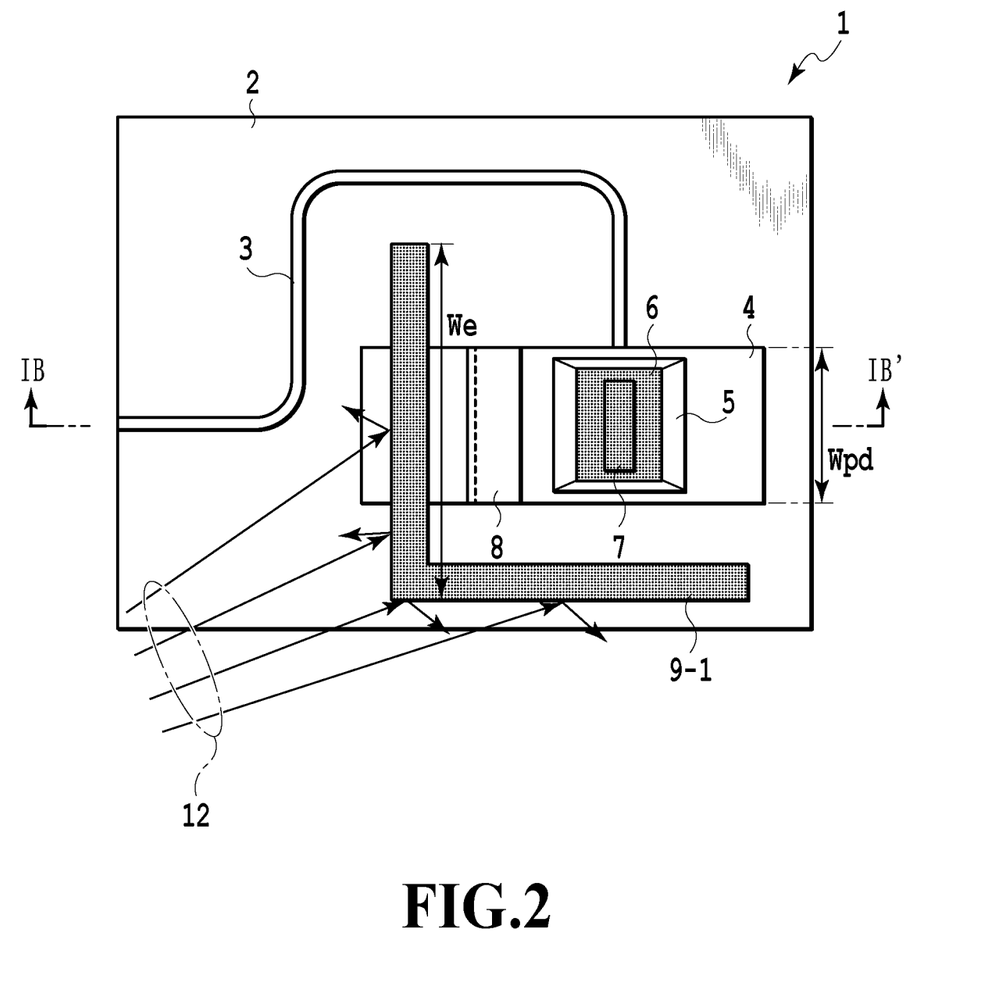
FIG. 2 is a diagram showing a part of an optical circuit including a light shielding structure according to a modified example of the first embodiment.

FIG. 2 is a diagram showing a part of an optical circuit including a light shielding structure according to a modified example of the first embodiment of the present invention. The configuration of FIG. 2 is different from that of FIGS. 1(*a*) and 1(*b*) in the position of the stray light 12 and the shape of the wiring electrode having the light shielding function. The configuration of the optical circuit 1 including the light reception element is substantially identical to the configuration of FIGS. 1(*a*) and 1(*b*). From the bottom of the stepped electrode 8 covering the upper surface and side surface of an edge including a side of the first semiconductor layer 4 close to the source of the stray light 12, a wiring electrode 9-1 is formed perpendicularly toward the surface layer of the optical circuit. Here, differently from the wiring electrode 9 including only a single wall-shaped portion as shown in FIGS. 1(*a*) and 1(*b*), the wiring electrode 9-1 has an L shape as a whole with an additional second wall-shaped portion angled as compared with the wiring electrode of FIGS. 1(*a*) and 1(*b*). The L-shaped wiring electrode 9-1 of FIG. 2 is effective in a case where the source of the stray light 12 reaches the light reception element not along the optical waveguide 3 as shown in FIGS. 1(*a*) and 1(*b*) but from the diagonally downward direction. FIG. 2 only shows another example of the shape of the wiring electrode. The angle between the two wall portions does not necessarily has to be 90° and can be changed appropriately according to the aspect of the stray light 12. The shape of the wiring electrode is also not limited to the L shape and may be a U shape including three wall-shaped portions. That is, it is only necessary that at least a part of the wiring electrode have a wall shape or column shape. Incidentally, the stepped electrode is not formed in the direction of the optical waveguide 3 connected to the first semiconductor layer 4 in order to prevent reflection of input light by the stepped electrode. Accordingly, only the bottom of the stepped electrode having the same configuration as FIGS. 1(*a*) and 1(*b*) may be extended in the direction of the optical waveguide 3 connected to the first semiconductor layer 4.

In a conventional technique, the light shielding structure is formed by a conductive via, wall, groove, or the like irrelevant to the function of the optical transmission/reception device in a position distant from the light reception element. Thus, as the degree of integration of the optical circuit increases, the light shielding structure becomes difficult to arrange. In the light shielding structure of the present invention shown in FIGS. 1(*a*) and 1(*b*), a width We of the wiring electrode 9 which extracts electrical output from the light reception element is expanded so as to be equal to or greater than a width Wpd of the light absorption portion of the light reception element, whereby stray light reaching the light absorption portion can be suppressed. The light shielding structure in the optical circuit of the present invention is characterized in that the wiring electrode 9, which is one of the constituent elements of the light reception element and can be arranged extremely close to the light absorption portion of the light reception element, is used as a structure for light shielding. Since the light shielding structure and the light absorption portion are extremely close to each other, the influence of diffraction of stray light can be reduced as compared with a conventional configuration in which the light reception element and the light shielding structure are distant from each other.

It is needless to say that the position, orientation, shape, and size of the wiring electrode 9 formed with respect to the region of the light reception element should be determined in consideration of the shape of each portion of the light reception element, the position of a source of target stray light in the entire optical circuit, and the propagation state of the target stray light. It is only necessary that the width We of the wiring electrode 9 be substantially equal to the width Wpd of the ion implantation region of the light reception element. Further, if the width We is about several times the width Wpd of the ion implantation region, the light shielding performance can be further increased without influencing the design of the light reception element. In addition, the light shielding performance for the light reception element can be further improved by reducing a distance L between the wiring electrode 9 and the region of the first semiconductor layer 4, which is the ion implantation region, to the extent that the buried layer 10 can be excellently prepared.

Second Embodiment

Figure 3A:
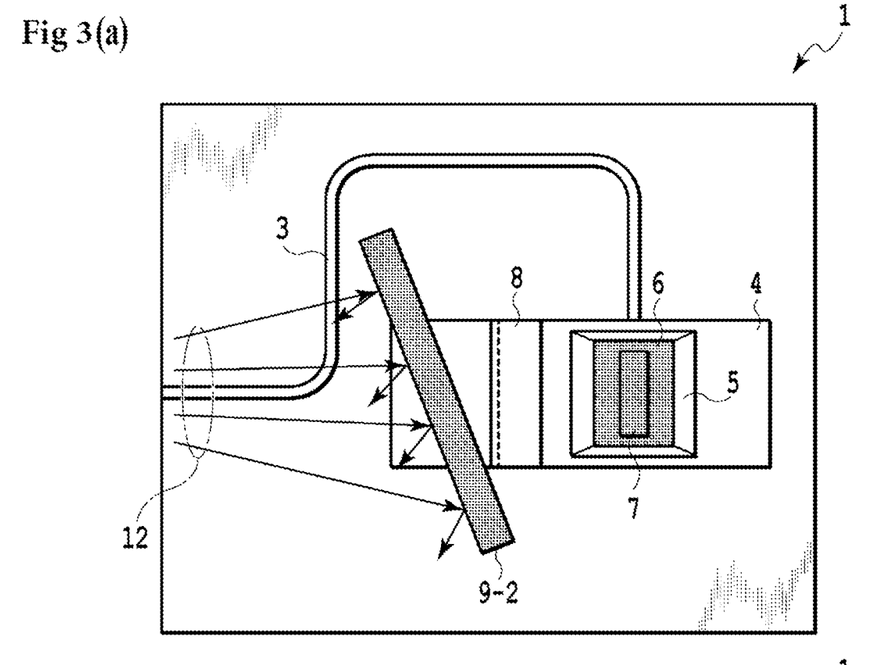
FIGS. 3(a) and (b) illustrate a part of an optical circuit including a light shielding structure according to a second embodiment of the present invention.
Figure 3B:
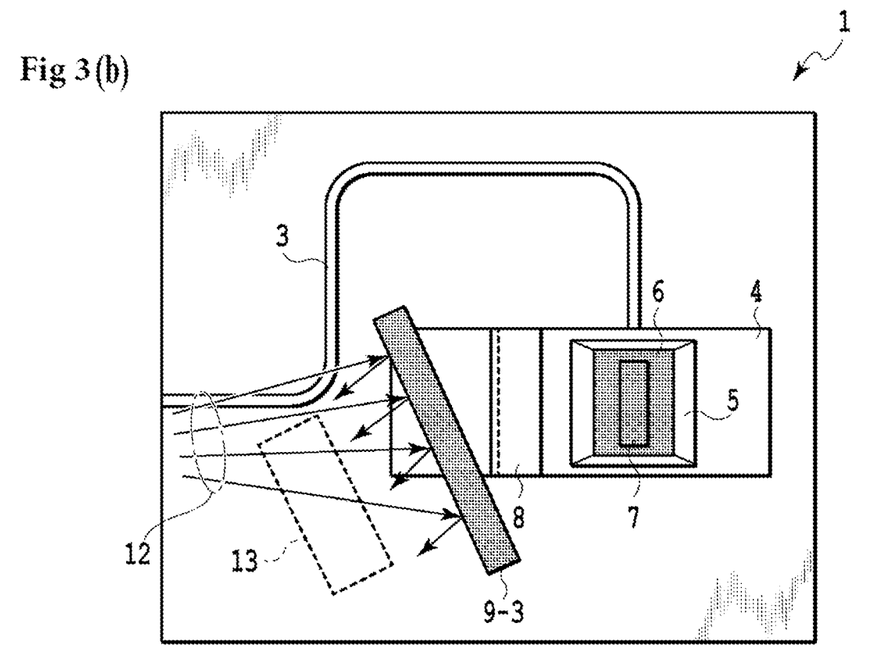

FIGS. 3(*a*) and 3(*b*) illustrate a part of an optical circuit including a light shielding structure according to a second embodiment of the present invention. FIGS. 3(*a*) and 3(*b*) show a wiring electrode 9-2 having the function of shielding the light reception element from light like FIGS. 1(*a*) and 1(*b*). The wiring electrode 9-2 is different from the wiring electrode 9 having the configuration of FIGS. 1(*a*) and 1(*b*) in that the orientation of the light shielding surface of the wiring electrode 9-2 is not parallel to but is slanted with respect to one side of the ion implantation region 4. In a case where a part of the optical waveguide 3 connected to the light reception element corresponds to the direction of arrival of the stray light 12 like the left part of the optical waveguide 3 in FIG. 3(*a*), reflected/diffused light can be prevented from being coupled again to the optical waveguide 3 by slanting the wiring electrode 9-2 having the light shielding function with respect to one side of the region of the first semiconductor layer 4. Further, in a case where stray light does not arrive perpendicularly to one side of the rectangular region of the first semiconductor layer 4 from the left of the drawing but arrives from a direction slanting with respect to one side of the rectangular region as shown in FIG. 3(*a*), it is only necessary to arrange the wiring electrode 9-2 to slant according to the slant of the stray light so as to cut off the stray light most effectively. The wiring electrode 9-2 only has to be formed to slant with respect to the light reception element such that a light shielding surface (wall surface) formed by the wiring electrode 9-2 is opposed to the front surface of the source of stray light.

FIG. 3(*b*) is a diagram showing another configuration example of the optical circuit including the light shielding structure according to the second embodiment. The configuration is different from that of FIG. 3(*a*) in further comprising an absorber 13 which further absorbs reflected/diffused light of stray light from a wiring electrode 9-3 in addition to the wiring electrode 9-3 having the light shielding function. As the absorber, the same ion implantation region as the first semiconductor layer 4 constituting the light absorption portion can be formed. A pseudo PD which does not function as the optical transmission/reception device may be arranged and used as the absorber.

Third Embodiment

Figure 4A:
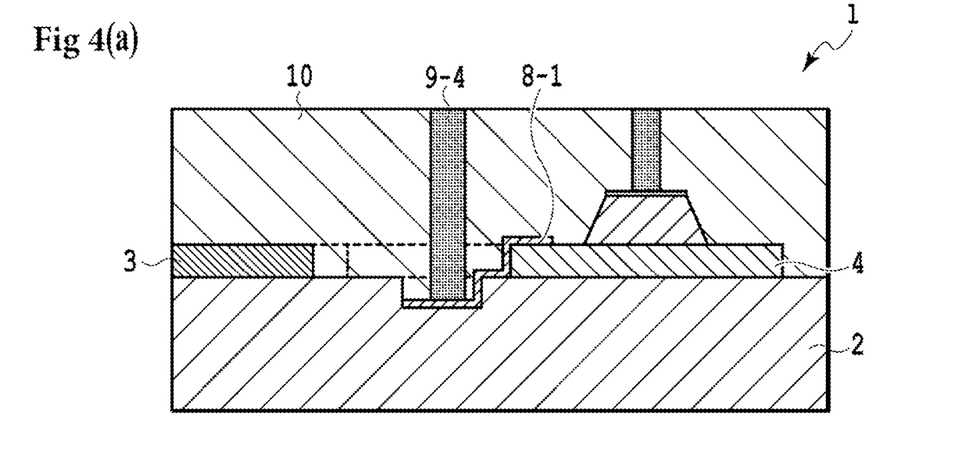
FIGS. 4(a), 4(b), and 4(c) illustrate a part of an optical circuit including a light shielding structure according to a third embodiment of the present invention.
Figure 4B:
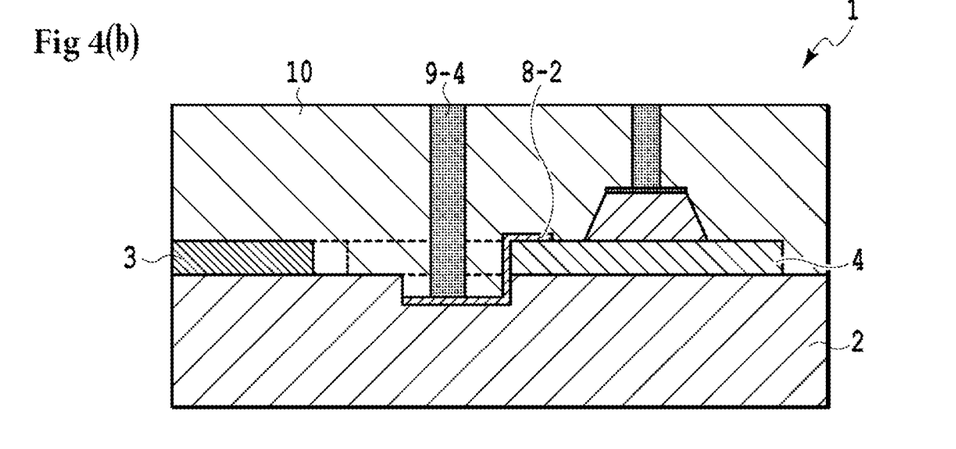
Figure 4C:
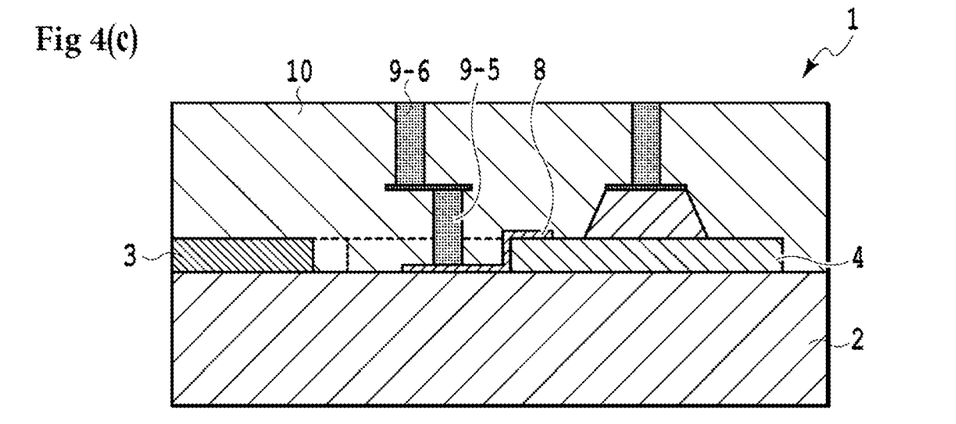

FIGS. 4(*a*), 4(*b*), and 4(*c*) illustrate a part of an optical circuit including a light shielding structure according to a third embodiment of the present invention. FIGS. 4(*a*), 4(*b*), and 4(*c*) are diagrams showing a cross section of an optical circuit perpendicular to the substrate 2 including the light reception element like FIG. 1(*b*) and show a modified example of the wiring electrode having the light shielding function. FIGS. 4(*a*) and 4(*b*) are diagrams showing an example in which the wiring electrode having the light shielding function is formed more deeply than the lower surface of the first semiconductor layer 4 to the inside of the substrate 2. In FIG. 4(*a*), a part of a stepped electrode is formed once to cover the upper surface and side surface of the edge of the first semiconductor region 4 and the upper surface of the substrate 2. After the substrate 2 is dug down, a stepped electrode 8-1 is completed up to the inside of the substrate 2. Finally, a wiring electrode 9-4 is formed perpendicularly toward the surface layer of the optical circuit. In FIG. 4(*b*), after the substrate 2 is dug down in a stroke, a stepped electrode 8-2 is completed and the wiring electrode 9-4 is finally formed perpendicularly toward the surface layer of the optical circuit. In the optical circuit, there is a possibility that stray light also propagates through the substrate under the optical waveguide 3. Accordingly, coupling between the light reception element and stray light can be suppressed more effectively by forming the wiring electrode 9-4 more internally from the surface layer of the optical circuit beyond the stepped electrode 8 on the surface of the substrate under the first semiconductor layer 4 of the light reception element as shown in FIGS. 4(*a*) and 4(*b*).

FIG. 4(*c*) shows an example of using multilayer wiring present in the optical circuit to form wiring electrodes having the light shielding function between multiple layers. In an optical circuit used for an optical transmission/reception device, multilayer wiring is used to realize the functions of a transmitter, a receiver, and the like. In each of the configurations shown in FIGS. 1 to 3, 4(a), and 4(b), the continuous wiring electrode 9, 9-1, 9-2, 9-3, or 9-4 is formed from the stepped electrode 8, which is formed as one piece on the upper surface and side surface of the edge of the first semiconductor region 4 and the upper surface of the substrate 2, to the surface layer of the optical circuit. As shown in FIG. 4(c), usable multilayer wiring configured in the optical circuit constituting the light reception element can be used to connect wiring electrodes 9-5 and 9-6 formed between layers to each other, thereby realizing the light shielding function as a whole. FIG. 4(c) shows an example of two wiring electrodes: the wiring electrode 9-5 formed perpendicularly from the bottom of the stepped electrode 8 toward an intermediate wiring layer and the wiring electrode 9-6 shifted to a positon close to the source of stray light and formed perpendicularly from the intermediate wiring layer toward the surface layer. The two wiring electrodes in the substrate plane can have any positional relationship as long as stray light can be suppressed. That is, as shown in FIG. 4(c), the positions may be shifted such that the wiring electrode in the upper layer is closer to the source of stray light than the wiring electrode in the lower layer. Conversely, the positions may be shifted such that the wiring electrode in the upper layer is closer to the light reception element than the wiring electrode in the lower layer. Further, although FIG. 4(c) shows the configuration in which two wiring electrodes are connected, wiring electrodes having the light shielding function may be formed by sequentially connecting three or more wiring electrodes across three or more layers.

Any of the wiring electrodes 9-4 to 9-6 shown in FIGS. 4(a), 4(b), and 4(c) is connected to an unshown wiring electrode on the surface layer of the optical circuit and functions as an electrode which extracts a detection electrical signal from the light reception element. In the light shielding structure of the present invention, the structure of the wiring electrode which the light reception element originally has is used to provide the wiring electrode with the function of extracting an electrical signal from the light reception element and the function of stray light shielding. Although FIGS. 4(a) and 4(b) only show the cross section, it is preferable that the wiring electrodes 9-4 to 9-6 have a width We equal to or greater than the width Wpd of the first semiconductor layer 4 like the wiring electrode 9 shown in FIGS. 1(a) and 1(b).

As described above in detail, according to the light shielding structure of the present invention, stray light can be suppressed using a part of an electrode structure which is close to the light reception element of the optical circuit and outputs an electrical signal from the light reception element. Also in an optical circuit with an increased degree of integration, the light shielding structure can be realized only by modifying a part of the existing configuration of the light reception element. Coupling between stray light and the light reception element can be effectively avoided without newly preparing a conductive via, wall, or groove influencing the properties of the optical circuit.

It should be noted that the light shielding structure described above is applicable regardless of the type of light reception element such as a PN-type photodiode (PD), a PIN-type PD, and an avalanche photodiode (APD). In the above configuration examples of FIGS. 1 to 4, the description has been given of a PIN-type PD in which the first semiconductor layer 4 is a p-type silicon layer, the second semiconductor layer 5 includes an i-type germanium layer and an n-type germanium layer, and these layers are stacked.

However, the light shielding structure of the present invention is also applicable to an APD comprising a silicon optical waveguide, a multiplication region, and a germanium light absorption region as disclosed in NPL 1. NPL 1 discloses a configuration in which a silicon optical waveguide, a multiplication region, and a germanium light absorption region are sequentially stacked. NPL 1 also discloses a configuration in which a germanium light absorption region is formed on a silicon optical waveguide and a multiplication region, which are in the same layer. In an APD having such a configuration, the silicon optical waveguide region is a light absorption portion in the lowermost layer. Coupling between the light absorption portion and stray light can be suppressed like the configuration of the PIN-type PD shown in FIGS. 1 to 4 by forming a wiring electrode perpendicularly to a surface layer of the optical circuit from the bottom of a stepped electrode formed as one piece on the upper surface and side surface of an edge including one side of the silicon optical waveguide region and the upper surface of a layer in contact with the lower side of the silicon optical waveguide region.

Fourth Embodiment

Both of the PIN-type PD and the PN-type PD described above have a configuration in which different semiconductor layers are stacked perpendicularly (vertically) on the substrate plane. NPL 2 discloses, as a configuration example of an Si modulator, a structure in which a PN junction is configured horizontally along a substrate plane in the center of an Si waveguide structure. In this manner, a light absorption portion can be configured horizontally using the PN junction and used as a PN-type PD in an optical circuit. In the case of using a horizontally formed PN-type PD for an optical circuit, a p-Si layer and an n-Si layer are a light absorption portion in the lowermost layer. A stepped electrode can be formed as one piece from the p-Si layer or n-Si layer on the upper surface and side surface of an edge including a side of the Si layer and the upper surface of a layer (such as an $SiO^2$ layer) in contact with the lower side of the Si layer. Coupling between the light absorption portion and stray light can be suppressed by forming a wiring electrode perpendicularly to the surface layer of the optical circuit from the bottom of the stepped electrode and configuring the wiring electrode to shield the light absorption portion of the PN junction from light.

A PIN-type PD can also be configured horizontally along the substrate plane as described above. As a light reception element for optical communication, a PIN-type PD is often used and the above configurations of embodiments 1 to 4 are applicable without any change.

Figure 5:
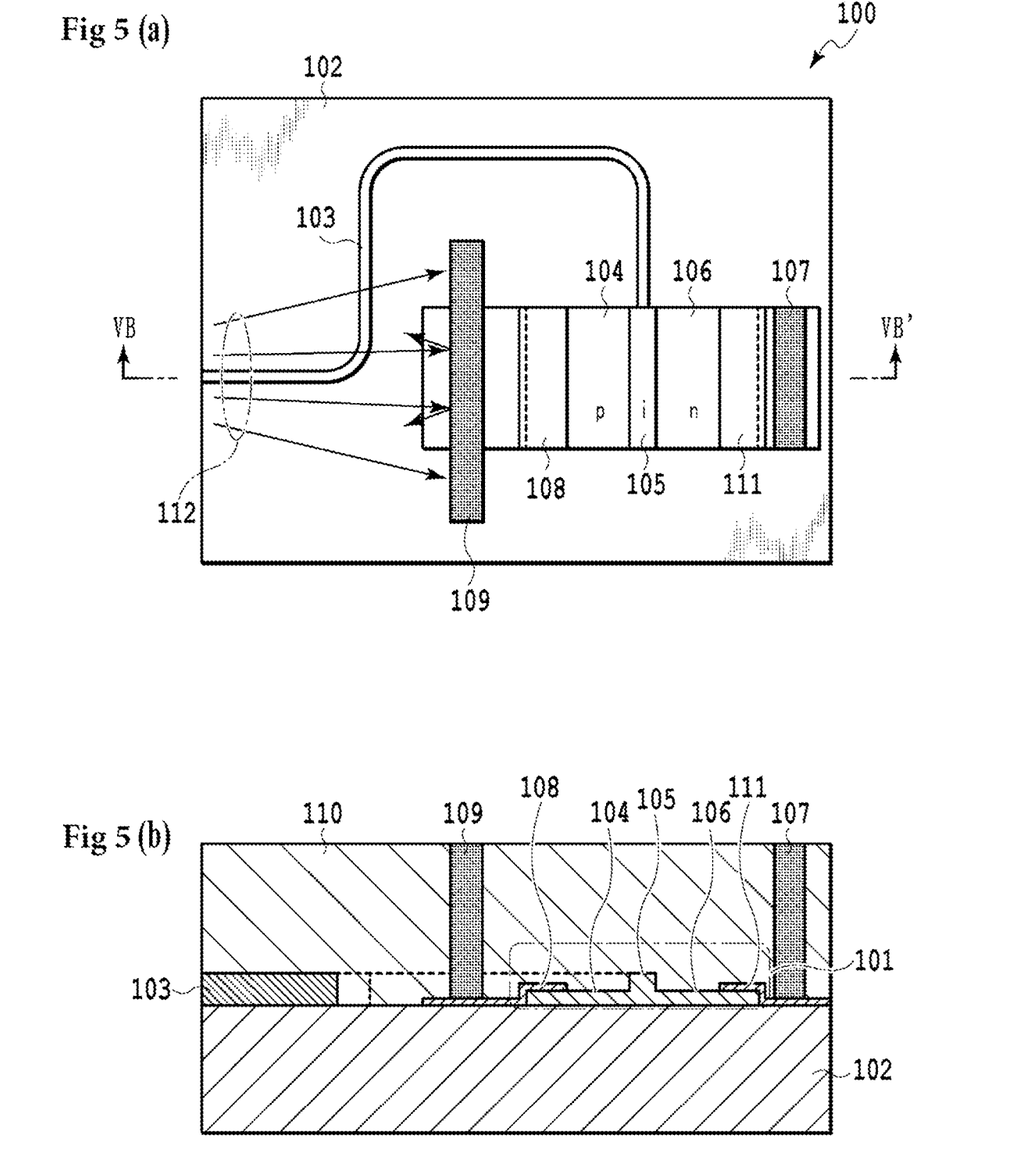
FIGS. 5(a) and 5(b) illustrate a part of an optical circuit including a light shielding structure according to a fourth embodiment of the present invention.

FIGS. 5(a) and 5(b) illustrate a part of an optical circuit including a light shielding structure according to a fourth embodiment of the present invention. FIG. 5(a) shows a top view of a part of an optical circuit 100 included in an optical transmission/reception device, the optical circuit including a light reception element. FIG. 5(b) shows a cross section perpendicular to the substrate plane including VB-VB' line passing through the light reception element. In the optical circuit of the present embodiment, a PIN junction configured horizontally along the substrate plane is shown as an example of the light reception element. The configuration of a wiring electrode 109 is identical to those of embodiments 1 to 4 except that the configuration of the light reception element is different from the configuration of stacking perpendicularly (vertically) on the substrate plane as shown in FIGS. 1 to 4. That is, in the light reception element, a p-type region 104, an i-type region 105, and an n-type region 106 are formed on a substrate 102 along the substrate plane, and a PIN-type PD is configured in a cross-sectional region 101 horizontally along the substrate plane. An optical waveguide 103 is configured at a height substantially equal to that of each of the semiconductor regions 104 to 106. In the PIN-type PD, a wiring electrode 107 is extracted also from the n-type region 106 via a stepped electrode 111.

In the configuration of the PIN-type PD shown in FIGS. 5(a) and 5(b), even if the positions of the p-type region 104 and the n-type region 106 are exchanged, only the orientations of the anode and cathode of the PD are changed and either of the wiring electrodes close to the source of stray light can be used for light shielding. Thus, as stated below, in the configuration of the PIN-type PD shown in FIGS. 5(a) and 5(b), it should be noted that either of the wiring electrode 109 on the p-type region 104 side and the wiring electrode 107 on the n-type region 106 side, or both of the wiring electrodes 109 and 107 can be simultaneously used for light shielding.

A stepped electrode 108 is formed continuously as one piece so as to cover the upper surface and side surface of an edge of the p-type region 104 and the upper surface of the substrate 2. The wiring electrode 109 is perpendicularly formed from the bottom of the stepped electrode 108 toward the surface layer of the optical circuit. The wiring electrode 109 has a width equal to or greater than the width of the p-type region 104, thereby preventing stray light 112 from being coupled to the light absorption portion of the PIN-type PD which is the light reception element. Similarly, the stepped electrode 111 is continuously formed as one piece so as to cover the upper surface and side surface of an edge of the n-type region 106 and the upper surface of the substrate 2. The wiring electrode 107 is formed perpendicularly from the bottom of the stepped electrode 111 toward the surface layer of the optical circuit. In the example of FIGS. 5(a) and 5(b), the wiring electrode 107 is across the light reception element from the source of the stray light 112. However, in a case where reflected or diffused light of the stray light arrive also from the right of FIGS. 5(a) and 5(b), the wiring electrode 107 can also prevent the reflected or diffused light from being coupled to the light absorption portion of the PIN-type PD like the wiring electrode 109.

Therefore, the present invention can be implemented as a light reception element comprising: a substrate 102: a first semiconductor layer 104 being configured above the substrate and operating as a light absorption portion: and a second semiconductor layer 106 being formed adjacent to the first semiconductor layer and having a semiconductor type different from a semiconductor type of the first semiconductor layer, the light reception element further comprising: a stepped electrode 108 being integrally configured on an upper surface of an edge including one or more sides of a region of the first semiconductor layer, a side surface of the edge, and an upper surface of a layer in contact with a lower side of the first semiconductor layer, the region being within a substrate plane of the substrate; and a wall-shaped or column-shaped wiring electrode 109 being formed perpendicularly from a bottom of the stepped electrode toward a surface layer, the wiring electrode extracting a detection electrical signal from the light reception element.

As described above, the light shielding structure of the optical circuit of the present invention is applicable regardless of the type of light reception element in that a wiring electrode for electrical signal extraction configured from an electrode configured on the lower surface of a semiconductor layer constituting a light absorption portion to a surface layer of an optical circuit can be used for the light shielding function.

INDUSTRIAL APPLICABILITY

The present invention is generally applicable to an optical communication system.

The invention claimed is:

1. A light reception element comprising:
a substrate;
a first semiconductor layer being configured above the substrate and operating as a light absorption portion; and
a second semiconductor layer being formed on the first semiconductor layer or adjacent to the first semiconductor layer and having a semiconductor type different from a semiconductor type of the first semiconductor layer,
the light reception element further comprising:
a stepped electrode being integrally formed on an upper surface of an edge of the first semiconductor layer, a side surface of the edge, and an upper surface of the substrate; and
a wall-shaped or column-shaped wiring electrode being formed perpendicularly from a bottom of the stepped electrode toward a surface layer, the wiring electrode extracting a detection electrical signal from the light reception element,
wherein the wiring electrode has a width equal to or greater than a length of the edge.

2. The light reception element according to claim 1, wherein
the wiring electrode is formed substantially in parallel to the side surface.

3. The light reception element according to claim 2, wherein the wiring electrode is a wall-shaped electrode, an L-shaped electrode, or a U-shaped electrode when a substrate plane is viewed.

4. The light reception element according to claim 2, wherein the wiring electrode includes:
a first interlayer wiring electrode formed perpendicularly from the bottom of the stepped electrode toward an intermediate wiring layer, the intermediate wiring layer being closer to the surface layer than the stepped electrode configured within the substrate; and
a second interlayer wiring electrode formed perpendicularly from the intermediate wiring layer toward the surface layer.

5. The light reception element according to claim 2, wherein the first semiconductor layer and the second semiconductor layer are formed along the substrate surface with an intermediate region interposed therebetween and have semiconductor types different from each other,
a PIN junction is formed by the first semiconductor layer, the intermediate region, and the second semiconductor layer, and
the stepped electrode is formed with respect to one or more sides of a region including the first semiconductor layer and the second semiconductor layer.

6. The light reception element according to claim 1, wherein
the wiring electrode is a wall-shaped electrode, an L-shaped electrode, or a U-shaped electrode when a substrate plane is viewed.

7. The light reception element according to claim 1, wherein the wiring electrode is formed to slant with respect to the side surface.

8. The light reception element according to claim 1, wherein the wiring electrode includes:
   a first interlayer wiring electrode formed perpendicularly from the bottom of the stepped electrode toward an intermediate wiring layer, the intermediate wiring layer being closer to the surface layer than the stepped electrode configured within the substrate; and
   a second interlayer wiring electrode formed perpendicularly from the intermediate wiring layer toward the surface layer.

9. The light reception element according to claim 1, wherein the first semiconductor layer and the second semiconductor layer are formed along the substrate surface with an intermediate region interposed therebetween and have semiconductor types different from each other,
   a PIN junction is formed by the first semiconductor layer, the intermediate region, and the second semiconductor layer, and
   the stepped electrode is formed with respect to one or more sides of a region including the first semiconductor layer and the second semiconductor layer.

10. The light reception element according to claim 1, wherein the substrate includes a layer being in contact with the first semiconductor layer and not contributing to light absorption.

* * * * *